United States Patent
Lin et al.

(10) Patent No.: US 12,130,380 B2
(45) Date of Patent: Oct. 29, 2024

(54) OVER-THE-AIR PRODUCT VERIFICATION TEST USING ANTENNA AND REFLECTOR ARRAYS

(71) Applicant: Jabil Inc., St. Petersburg, FL (US)

(72) Inventors: Lin Lin, St. Petersburg, FL (US); Kevin Loughran, St. Petersburg, FL (US); Jason Wildt, St. Petersburg, FL (US); Lei Zhang, St. Petersburg, FL (US); Viktor Bondarchuk, St. Petersburg, FL (US); Yu Zhang, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 161 days.

(21) Appl. No.: 17/988,503

(22) Filed: Nov. 16, 2022

(65) Prior Publication Data

US 2023/0076287 A1    Mar. 9, 2023

Related U.S. Application Data

(63) Continuation-in-part of application No. 16/362,409, filed on Mar. 22, 2019, now Pat. No. 11,579,179.
(Continued)

(51) Int. Cl.
*G01R 27/04* (2006.01)
*G01R 29/08* (2006.01)
(Continued)

(52) U.S. Cl.
CPC .............. *G01S 7/40* (2013.01); *G01R 29/0871* (2013.01); *G01R 29/105* (2013.01)

(58) Field of Classification Search
CPC .............. G01R 29/0871; G01R 29/105; G01R 29/0821; G01R 29/0892; G01R 29/0864; G01R 31/2822; G01R 31/2884
See application file for complete search history.

(56) References Cited

U.S. PATENT DOCUMENTS 6,088,582 A * 7/2000 Canora .............. H04B 17/309
                                                      455/67.14
6,657,214 B1    12/2003 Foegelle et al.
(Continued)

FOREIGN PATENT DOCUMENTS

CN        102589678 A     7/2012
CN        204044363 U    12/2014
(Continued)

OTHER PUBLICATIONS

Chinese Office Action issued in App. No. CN201980066697, dated Nov. 29, 2023, 7 pages.
(Continued)

*Primary Examiner* — Thang X Le
(74) *Attorney, Agent, or Firm* — Young Basile Hanlon & MacFarlane, P.C.

(57) ABSTRACT

Systems and methods for performing over-the-air verification tests for radar. A test chamber includes multiple sections, the sections separated by metal walls. The inner surfaces of the metal walls include absorbers. Each section includes defined testing devices to verify a defined function of a radar device. The defined testing devices can include a horn antenna and corner reflector. Each section has a defined number of rows. Each row has a defined testing device. Test fixtures hold a defined number of the radar devices in correspondence with the defined number of rows. The defined number of the radar devices placed on the test fixture via a placement device. A positioner to align under the sections and move the test fixtures through the sections of the test chamber and a controller to control operation of the positioner, the radar devices, and the placement device to execute over-the-air verification of the radar devices.

20 Claims, 2 Drawing Sheets

Related U.S. Application Data

(60) Provisional application No. 63/281,254, filed on Nov. 19, 2021, provisional application No. 62/729,687, filed on Sep. 11, 2018.

(51) Int. Cl.
*G01R 29/10* (2006.01)
*G01S 7/40* (2006.01)

(56) References Cited

U.S. PATENT DOCUMENTS

| | | | |
|---|---|---|---|
| 8,295,777 B1* | 10/2012 | Yenney | H04W 24/06 |
| | | | 455/442 |
| 10,326,539 B2 | 6/2019 | Lloyd | |
| 2008/0024373 A1 | 1/2008 | Khosravi et al. | |
| 2011/0084887 A1* | 4/2011 | Mow | G01R 29/10 |
| | | | 343/703 |
| 2011/0270567 A1 | 11/2011 | Mow et al. | |
| 2014/0161164 A1 | 6/2014 | Emmanuel et al. | |
| 2015/0048980 A1* | 2/2015 | Chin | G01R 31/2822 |
| | | | 343/703 |
| 2016/0212641 A1 | 7/2016 | Kong | |
| 2017/0102409 A1 | 4/2017 | Sarhad | |
| 2018/0006745 A1 | 1/2018 | Vanwiggeren | |
| 2018/0062971 A1 | 3/2018 | Kyosti et al. | |
| 2018/0254840 A1 | 9/2018 | Foegelle | |
| 2019/0036621 A1 | 1/2019 | Vanwiggeren | |
| 2019/0115941 A1 | 4/2019 | Noda | |
| 2019/0356397 A1 | 11/2019 | DaSilva et al. | |
| 2020/0081050 A1 | 3/2020 | Lin et al. | |

FOREIGN PATENT DOCUMENTS

| | | | |
|---|---|---|---|
| CN | 105277922 A | | 1/2016 |
| CN | 107026695 | | 8/2017 |
| CN | 107026695 A | | 8/2017 |
| CN | 107543978 | | 1/2018 |
| CN | 107543978 A | | 1/2018 |
| CN | 108254629 | | 7/2018 |
| CN | 207636670 U | | 7/2018 |
| CN | 110275146 A | | 9/2019 |
| CN | 110568413 A | | 12/2019 |
| CN | 212905426 U | | 4/2021 |
| CN | 113447895 A | | 9/2021 |
| JP | 3257170 | | 2/2002 |
| JP | 5170078 | | 3/2013 |
| KR | 101878530 | | 7/2018 |
| WO | 2014197185 | | 12/2014 |

OTHER PUBLICATIONS

Chinese Office Action issued in App. No. CN201980066697, dated Jun. 8, 2024, 6 pages.

* cited by examiner

OVER-THE-AIR PRODUCT VERIFICATION TEST USING ANTENNA AND REFLECTOR ARRAYS

CROSS REFERENCE TO RELATED APPLICATION

This application is a continuation-in-part of U.S. patent application Ser. No. 16/362,409 entitled "Method for Providing an Antenna Probe Array for a Compact Anechoic Chamber for Active and Passive Antenna Over-the-Air Testing", filed on Mar. 22, 2019, which claims priority to U.S. Provisional Application No. 62/729,687, filed on Sep. 11, 2018, and claims priority to U.S. Provisional Application No. 63/281,254, filed on Nov. 19, 2021, the contents of which are all incorporated by reference herein.

TECHNICAL FIELD

This disclosure relates to radar devices and in particular, verification testing of radar devices.

BACKGROUND

Radar devices or units are used in a variety of applications or industries including in the automotive industry. Automobiles can use radar devices, for example, to detect objects, and determine distances. Thousands of these radar devices are produced. At the end of the production line, each radar device needs to be calibrated and its performance needs to be verified.

Consequently, there is a need for an efficient and relatively fast operational and functional verification system that can be used for multiple radar devices.

SUMMARY

Disclosed herein are systems and methods for performing over-the-air (OTA) verification tests for radar devices.

BRIEF DESCRIPTION OF THE DRAWINGS

The disclosure is best understood from the following detailed description when read in conjunction with the accompanying drawings and are incorporated into and thus constitute a part of this specification. It is emphasized that, according to common practice, the various features of the drawings are not to-scale. On the contrary, the dimensions of the various features are arbitrarily expanded or reduced for clarity.

DETAILED DESCRIPTION

Figure 1:
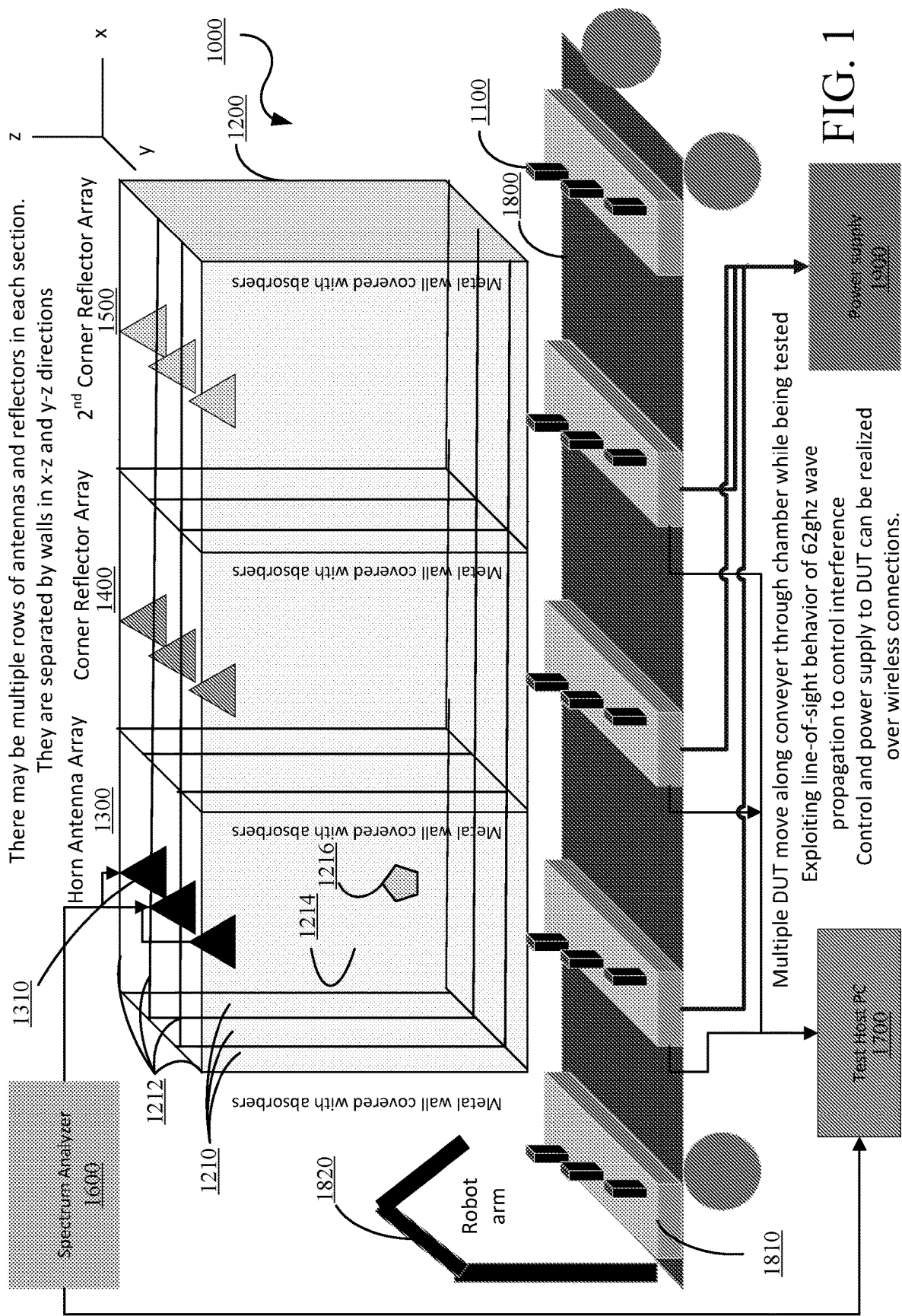
FIG. 1 is a block diagram of an example OTA verification system in accordance with implementations.

The figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, and methods. Those of ordinary skill may thus recognize that other elements and/or steps may be desirable or necessary to implement the devices, systems, and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Embodiments are provided throughout so that this disclosure is sufficiently thorough and fully conveys the scope of the disclosed embodiments to those who are skilled in the art. Numerous specific details are set forth, such as examples of specific aspects, devices, and methods, to provide a thorough understanding of embodiments of the present disclosure. Nevertheless, it will be apparent to those skilled in the art that certain specific disclosed details need not be employed, and that embodiments may be embodied in different forms. As such, the exemplary embodiments set forth should not be construed to limit the scope of the disclosure.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, steps, operations, elements, and/or components, but do not preclude the presence or addition of one or more other features, steps, operations, elements, components, and/or groups thereof.

The steps, processes, and operations described herein are thus not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

Yet further, although the terms first, second, third, etc. may be used herein to describe various elements, steps or aspects, these elements, steps or aspects should not be limited by these terms. These terms may be only used to distinguish one element or aspect from another. Thus, terms such as "first," "second," and other numerical terms when used herein do not imply a sequence or order unless clearly indicated by the context. Thus, a first element, step, component, region, layer or section discussed below could be termed a second element, step, component, region, layer or section without departing from the teachings of the disclosure.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

The non-limiting embodiments described herein are with respect to over-the-air (OTA) verification systems for radar devices. The over-the-air (OTA) verification systems for radar devices and methods for using same can be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the system and the methods.

Disclosed herein are implementations of over-the-air (OTA) test or verification systems for radar devices. In some implementations, the over-the-air (OTA) verification systems can test multiple radars nearly simultaneously in an anechoic test chamber. That is, a chamber that is free from echoes. The OTA test system is compact in size and suitable for factory installation. The OTA test system can include an array of antenna probes and reflectors to support nearly simultaneous radio frequency (RF) performance test and calibration. It has efficient and automatic handling mechanisms for radars under test (RUT) or devices under test (DUT). The RUTs and/or DUTs are placed on test fixtures on a positioner. A mechanical system can automatically lock the test fixture into a fixed location on the positioner. The positioner will move the RUTs and/or DUTs to the test chamber for the OTA test. The test chamber has several sections, one for each operational or functional test or verification case. After one test case completed, the positioner can move the RUTs to the next chamber section for the next test case. In this way, multiple RUTs and/or DUTs are tested in multiple sections at the same time.

In some implementations, the anechoic test chamber can be implemented in a cubic format, shape, or footprint. The anechoic test chamber has a positioner configured to handle RUT and/or DUT placement. The positioner is a conveyer type positioner which is configured to move the RUTs and/or DUTs from left to right (or right to left) in a step by step way through the system. A robot arm can be used to place RUTs and/or DUTs on the positioners. In some implementations, the positioner can place the RUTs and/or DUTs at the bottom of the chamber sections. If the RUTs and/or DUTs operate at high frequencies where electro-magnetic waves travel along the line of sight, the RUTs and/or DUTs can be placed underneath each chamber section and not completely sealed in the chamber (i.e., partially enclosed). If the RUTs and/or DUTs operate at lower frequencies where interference signals may leak through the openings at the bottom of the chamber sections, the test fixtures can be raised up to seal the RUTs and/or DUTs into the chamber sections to eliminate interference between the RUTs and/or DUTs. In some implementations, communications and power supply to the RUTs and/or DUTs can be implemented through cables to the test fixtures holding the RUTs and/or DUTs. In some implementations, communications and power supply to the RUTs and/or DUTs can be implemented through wireless connections. Each RUT and/or DUT has a line-of-sight to an antenna probe or array, or a reflector array depending on which chamber section the RUT and/or DUT is in. The chamber is constructed with metal sheets. Antennas and reflectors are separated with metal walls. The inner surface of the metal walls are covered with absorber materials.

In some implementations, the anechoic test chamber can be implemented in a cylindrical format, shape, or footprint. The anechoic test chamber has a positioner configured to handle RUT and/or DUT placement. The positioner is a rotating disc type positioner configured to move RUTs and/or DUTs clockwise section by section through the system. A robot arm can be used to place RUTs and/or DUTs on the positioners. In some implementations, the positioner can place the RUTs at the bottom of the chamber sections. If the RUTs and/or DUTs operate at high frequencies where electro-magnetic waves travel along the line of sight, the RUTs and/or DUTs can be placed underneath each chamber section and not completely sealed in the chamber. If the RUTs and/or DUTs operate at lower frequencies where interference signals may leak through the openings at the bottom of the chamber sections, the test fixtures can be raised up to seal the RUTs and/or DUTs into the chamber sections to eliminate interference between the RUTs and/or DUTs. In some implementations, communications and power supply to the RUTs and/or DUTs can be implemented through cables to the test fixtures holding the RUTs and/or DUTs. In some implementations, communications and power supply to the RUTs and/or DUTs can be implemented through wireless connections. Each RUT and/or DUT has a line-of-sight to an antenna probe or array, or a reflector array depending on which chamber section the RUT and/or DUT is in. The chamber is constructed with metal sheets. Antennas and reflectors are separated with metal walls. The inner surface of the metal walls are covered with absorber materials.

FIG. 1 is a block diagram of an example OTA verification system 1000 for testing RUTs and/or DUTs 1100 in accordance with implementations. The system 1000 can include a test chamber 1200. In implementations, the test chamber 1200 is an anechoic test chamber. The test chamber 1200 can include multiple sections 1210 (some illustrative leads shown in FIG. 1). Each section 1210 can be separated by metal walls 1212 (some illustrative leads shown in FIG. 1). Inner surfaces 1214 of the metal walls 1212 can include or be lined with one or more absorbers 1216 (one shown in FIG. 1). For example, the absorbers 1216 are radio frequency (RF) absorbers. The multiple sections 1210 can be configured in an array or matrix of columns and rows. Each column of the matrix can enable a functional or operability verification test. For example, one column can include a horn antenna array 1300, another column can include a corner reflector array 1400, and yet another column can include a second corner reflector array 1500. Each horn antenna 1310 (one lead shown in FIG. 1) in the horn antenna array 1300 is connected to a spectrum analyzer 1600, which in turn is connected to a test host computing device or platform 1700.

The system 1000 includes a positioner 1800 for moving the RUTs and/or DUTs 1100 along the test chamber 1200. For example, the positioner 1800 can be a conveyer belt positioner. Test fixtures 1810 are spatially positioned on the positioner in alignment with the widths of the sections 1210 in the test chamber 1200. That is, for a given position, there will be a test fixture 1810 positioned underneath each section 1210 of the test chamber 1200. Each test fixture 1810 can hold multiple RUTs and/or DUTs 1110. The number of RUTs and/or DUTs 1110 on each test fixture 1810 are in alignment with the number of rows in each column in the test chamber 1200. A robotic arm, a pick and place machine, or similar apparatus ("placement device") 1820 can place the RUTs and/or DUTs 1110 on the positioner 1800. In some implementations, when the RUTs and/or DUTs 1110 operate at high frequencies where electro-magnetic waves travel along the line of sight, the RUTs and/or DUTs 1110 can be placed underneath each chamber or section 1210 and are not completely sealed in the chamber or section 1210. In some implementation, when the RUTs and/or DUTs 1110 operate at lower frequencies where interference signals may leak through the openings at the bottom of the chamber or sections 1210, the test fixtures 1810 can be raised up to seal the RUTs and/or DUTs 1110 into the chamber or sections 1210 to eliminate interference between the RUTs and/or DUTs 1110.

The test host computing device or platform 1700 (a test platform, computing device, or controller) can control or manage operation of the positioner 1800, the placement device 1820, the spectrum analyzer 1600, and the RUTs and/or DUTs 1110. The control signaling can be provided via wired connections, wireless connections, or combinations thereof, as appropriate and applicable. A power supply 1900 can provide power to the positioner 1800, the placement device 1820, the spectrum analyzer 1600, and the RUTs and/or DUTs 1110. The power can be provided via wired connections, wireless connections, or combinations thereof, as appropriate and applicable.

Operationally, the test computing device 1700 can have the placement device 1820 place the RUTs and/or DUTs 1110 on the test fixture 1810. The test computing device 1700 can then have the positioner 1800 position the test fixture 1810 in alignment with the appropriate section 1210 of the test chamber 1200. Verification tests can be performed using the RUTs and/or DUTs 1110, the spectrum analyzer 1600, the horn antenna array 1300, the corner reflector array 1400, the second corner reflector array 1500, and/or other sections (not shown) as needed. The RUTs and/or DUTs 1110 can be activated or triggered for OTA verification testing. The RUTs and/or DUTs 1110 can be removed from the test fixture 1810 using a placement device (not shown but can be similar to placement device 1820) after completion of the verification tests.

Figure 2:
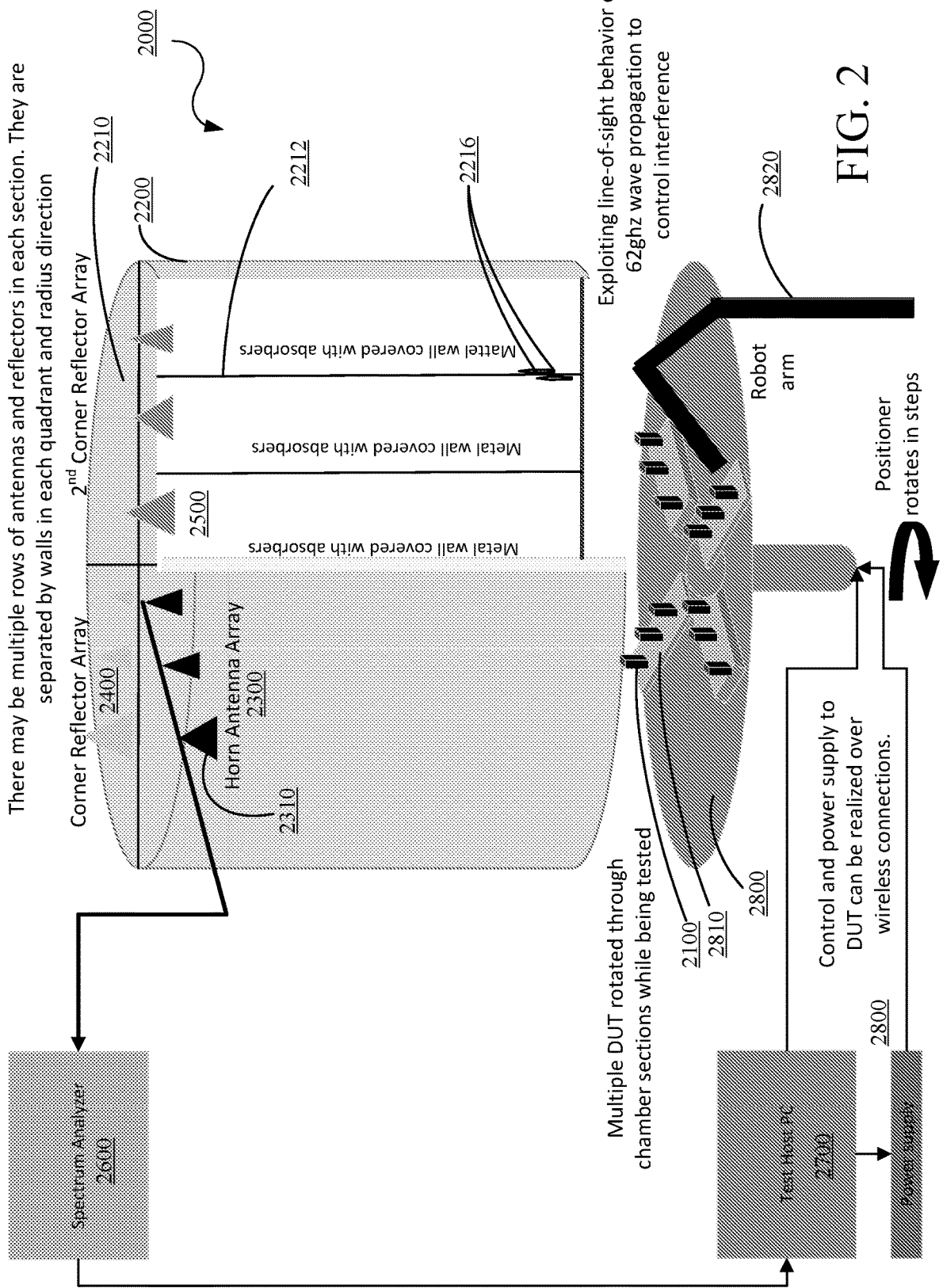
FIG. 2 is a block diagram of another example OTA verification system in accordance with implementations.

FIG. 2 is a block diagram of another example OTA verification system 2000 for testing RUTs or DUTs 2100 in accordance with implementations. The system 2000 can include a cylindrical test chamber 2200. In implementations, the cylindrical test chamber 2200 is an anechoic cylindrical test chamber. The cylindrical test chamber 2200 can include quadrants 2210. Each quadrant 2210 can be configured with multiple rows. Each quadrant 2210 and row can be separated by metal walls 2212. Inner surfaces 2214 of the metal walls 2212 can include or be lined with absorbers 2216. For example, the absorbers 2216 are RF absorbers. Each quadrant 2210 can enable a functional or operability verification test. For example, one quadrant 2210 can include a horn antenna array 2300, another quadrant 2210 can include a corner reflector array 2400, and yet another quadrant 2210 can include a second corner reflector array 2500. Each of the horn antenna 2310 in the horn antenna array 2300 are connected to a spectrum analyzer 2600, which in turn is connected to a test host computing device or platform 2700.

The system 2000 includes a rotating positioner 2800 for moving the RUTs or DUTs 2100 along the test chamber 2200. Test fixtures 2810 are spatially positioned on the positioner 2800 in alignment with the widths of the quadrants 2210 in the test chamber 2200. That is, for a given position, there will be a test fixture 2810 positioned underneath each quadrant 2210 of the test chamber 2200. Each test fixture 2810 can hold multiple RUTs or DUTs 2100. The number of RUTs or DUTs 2100 on each test fixture 2810 are in alignment with the number of rows in each quadrant 2210 in the test chamber 2200. A robotic arm, a pick and place machine, or similar apparatus ("placement device") 2820 can place the RUTs or DUTs 2100 on the positioner 2800. In some implementations, when the RUTs or DUTs 2100 operate at high frequencies where electro-magnetic waves travel along the line of sight, the RUTs or DUTs 2100 can be placed underneath each chamber or quadrant 2210 and are not completely sealed in the chamber or quadrant 2210. In some implementation, when the RUTs or DUTs 2100 operate at lower frequencies where interference signals may leak through the openings at the bottom of the chamber or quadrant 2210, the test fixtures 2810 can be raised up to seal the RUTs or DUTs 2100 into the chamber or quadrant 2210 to eliminate interference between the RUTs or DUTs 2100.

The test host computing device or platform 2700 (test platform, computing device, or controller) can control or manage operation of the positioner 2800, the placement device 2820, the spectrum analyzer 2600, and the RUTs or DUTs 2100. The control signaling can be provided via wired connections, wireless connections, or combinations thereof, as appropriate and applicable. A power supply 2800 can provide power to the positioner 2800, the placement device 2820, the spectrum analyzer 2600, and the RUTs or DUTs 2100. The power can be provided via wired connections, wireless connections, or combinations thereof, as appropriate and applicable.

Operationally, the test computing device 2700 can have the placement device 2820 place the RUTs or DUTs 2100 on the test fixture 2810. The test computing device 2700 can then have the positioner 2800 position the test fixture 2810 in alignment with the appropriate quadrant 2210 of the test chamber 2200. Verification tests can be performed using the RUTs or DUTs 2100, the spectrum analyzer 2600, the horn antenna array 2300, the corner reflector array 2400, the second corner reflector array 2500, and/or other sections (not shown) as needed. The RUTs or DUTs 2100 can be activated or triggered for OTA verification testing. The RUTs or DUTs 2100 can be removed from the test fixture 2810 using a placement device (not shown but similar to placement device 2820) after completion of the verification tests.

The construction and arrangement of the methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials and components, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions, and arrangement of the exemplary embodiments without departing from the scope of the present disclosure.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps, and decision steps.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A system for over-the-air verification testing of radar devices, the system comprising:
   a test chamber including multiple sections, each section separated from another section by metal walls;
   each section configured with a defined testing device to verify a defined function or operation of the radar devices;
   each section including a defined number of rows, each row configured with a same defined testing device;
   test fixtures configured to hold a defined number of the radar devices in correspondence with the defined number of rows, the defined number of the radar devices placed on the test fixture via a placement device;
   a positioner configured to align the test fixtures under the sections and move the test fixtures through the sections of the test chamber; and
   a controller configured to control operation of the positioner, the radar devices, and the placement device to execute over-the-air verification of the radar devices.

2. The system of claim 1, wherein inner surfaces of the metal walls include absorbers.

3. The system of claim 1, wherein inner surfaces of the metal walls include radio frequency absorbers.

4. The system of claim 1, wherein the test chamber is an anechoic test chamber.

5. The system of claim 1, wherein for one section the defined testing device is a horn antenna.

6. The system of claim 5, wherein for another section the defined testing device is a corner reflector.

7. The system of claim 1, wherein each section has a different defined testing device.

8. The system of claim 6, wherein the positioner is configured to place the defined number of the radar devices so as to partially enclose the defined number of the radar devices in associated sections of the test chamber when the radar devices operate at high frequencies where electromagnetic waves travel along the line of sight.

9. The system of claim 8, wherein the positioner is configured to place the defined number of the radar devices so as to enclose the defined number of the radar devices in associated sections of the test chamber when the radar devices operate at lower frequencies where interference signals leak through openings at bottoms of the associated sections.

10. The system of claim 9, wherein the positioner is configured to raise the test fixtures to enclose the defined number of the radar devices in the associated sections to eliminate interference between the defined number of the radar devices.

11. A method for over-the-air verification testing of radar devices, the method comprising:
    placing, by a placement device, a number of the radar devices in one or more test fixtures;
    positioning, by a positioner, the one or more test fixtures under and through multiple sections in a test chamber, the sections separated by metal walls, each section including rows corresponding to the number of the radar devices in the one or more test fixtures, each section including a defined testing device to verify a defined function or operation of the radar device, and each row in the each section including the defined testing device; and
    controlling, by a controller, execution of over-the-air verification of the radar devices by controlling the positioner, the radar devices, and the placement device.

12. The method of claim 11, the method further comprising:
    providing absorbers on inner surfaces of the metal walls.

13. The method of claim 11, the method further comprising:
    providing radio frequency absorbers on inner surfaces of the metal walls.

14. The method of claim 11, the method further comprising:
    provisioning the test chamber as an anechoic test chamber.

15. The method of claim 11, wherein for one section the defined testing device is a horn antenna.

16. The method of claim 15, wherein for another section the defined testing device is a corner reflector.

17. The method of claim 11, wherein each section has a different defined testing device.

18. The method of claim 16, the positioning further comprising:
    placing, by the positioner, the defined number of the radar devices to partially enclose the defined number of the radar devices in associated sections of the test chamber when the radar devices operate at high frequencies where electro-magnetic waves travel along the line of sight.

19. The method of claim 18, the positioning further comprising:
    placing, by the positioner, the defined number of the radar devices so as to enclose the defined number of the radar devices in associated sections of the test chamber when the radar devices operate at lower frequencies where interference signals leak through openings at bottoms of the associated sections.

20. The method of claim 19, the positioning further comprising:
    raising, by the positioner, the test fixtures to enclose the defined number of the radar devices in the associated sections to eliminate interference between the defined number of the radar devices.

* * * * *